(12) United States Patent
Aoki (10) Patent No.: US 7,795,916 B2
(45) Date of Patent: Sep. 14, 2010

(54) LEVEL SHIFT CIRCUIT

(75) Inventor: Mikio Aoki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/425,690

(22) Filed: Apr. 17, 2009

(65) Prior Publication Data

US 2009/0278587 A1 Nov. 12, 2009

(30) Foreign Application Priority Data

Apr. 18, 2008 (JP) ............................. 2008-109299

(51) Int. Cl.
*H03K 19/094* (2006.01)
(52) U.S. Cl. ............................. 326/68; 326/81; 326/63; 327/333
(58) Field of Classification Search .................. 326/62, 326/63, 65, 68, 81–83, 86, 87; 327/108, 327/109, 333
See application file for complete search history.

(56) References Cited

U.S. PATENT DOCUMENTS

| | | | | |
|---|---|---|---|---|
| 6,064,227 A * | 5/2000 | Saito | ............................ | 326/68 |
| 6,487,687 B1 * | 11/2002 | Blake et al. | .................. | 714/724 |
| 6,842,041 B1 * | 1/2005 | Om'Mani et al. | .............. | 326/38 |
| 6,842,045 B2 * | 1/2005 | Shimazaki et al. | ............. | 326/95 |
| 6,985,022 B2 * | 1/2006 | Kanno et al. | .................. | 327/333 |
| 7,053,657 B1 * | 5/2006 | Peng | ............................ | 326/68 |
| 7,151,391 B2 * | 12/2006 | Chen et al. | ..................... | 326/68 |
| 7,205,820 B1 * | 4/2007 | Yeung et al. | ................. | 327/333 |
| 7,446,569 B2 * | 11/2008 | Lee | ............................... | 326/83 |

FOREIGN PATENT DOCUMENTS

JP 2006-173899 6/2006

* cited by examiner

*Primary Examiner*—James H. Cho
*Assistant Examiner*—Christopher Lo
(74) *Attorney, Agent, or Firm*—Young & Thompson (57) ABSTRACT

A level shift circuit insusceptible to mistaken operations at the time of disengagement of a standby state is disclosed. The level shift circuit includes a level converter circuit 5, a barrier gate circuit 2 and a holding circuit (MMP1, MMP2). The level converter circuit converts a signal level of a circuit operating in a VDD1 system to a signal level of a VDD2 system. The barrier gate circuit is responsive to a standby signal (STBY) to fix input signals (AB, AAB) of the level converter circuit 5 at a LOW level. The holding circuit holds an output of the level converter circuit 5 at a constant voltage when the input signals (AB, AAB) are at the LOW level (FIG. 1).

13 Claims, 8 Drawing Sheets

LEVEL SHIFT CIRCUIT

REFERENCE TO RELATED APPLICATION

This application is based upon and claims the benefit of the priority of Japanese patent application No. 2008-109299 filed on Apr. 18, 2008, the disclosure of which is incorporated herein in its entirety by reference thereto.

TECHNICAL FIELD

This invention relates to a level shift circuit and, more particularly to a level shift circuit in which a signal transmitting side, as a counterpart of a signal receiving side, may be in a stand-by state.

BACKGROUND

Recently, there is a demand from the side of the market for an LSI circuit of lower power consumption. As regards an LSI circuit, such type of an LSI circuit in which the power supply for its core part is partially or wholly turned off to reduce the stand-by power is being offered to the market. There is also such a system in which, since it is not the total of the functions of the system that is to be in stand-by state, the LSI circuits other than that in a stand-by state are set into operation.

Thus, in an LSI circuit driven by a plurality of power supplies, the logic state of the LSI circuit, the power supply of which is partially turned off, needs to be in some form of a definitive state. For example if, in an LSI circuit, the power supply of a core part of the circuit is turned off, it is necessary to maintain the power supply for an I/O part of the circuit in on-state in order to keep on supplying the power and outputting a definitive logic state of some form or other. Patent Document 1 shows such a technique in which the power supply of an I/O part is maintained in an on-state to keep on supplying the power to provide a definitive logic state of the I/O buffer with the use of a stand-by signal STBY indicating the state of the power supply voltage of the core part.

Figure 6:
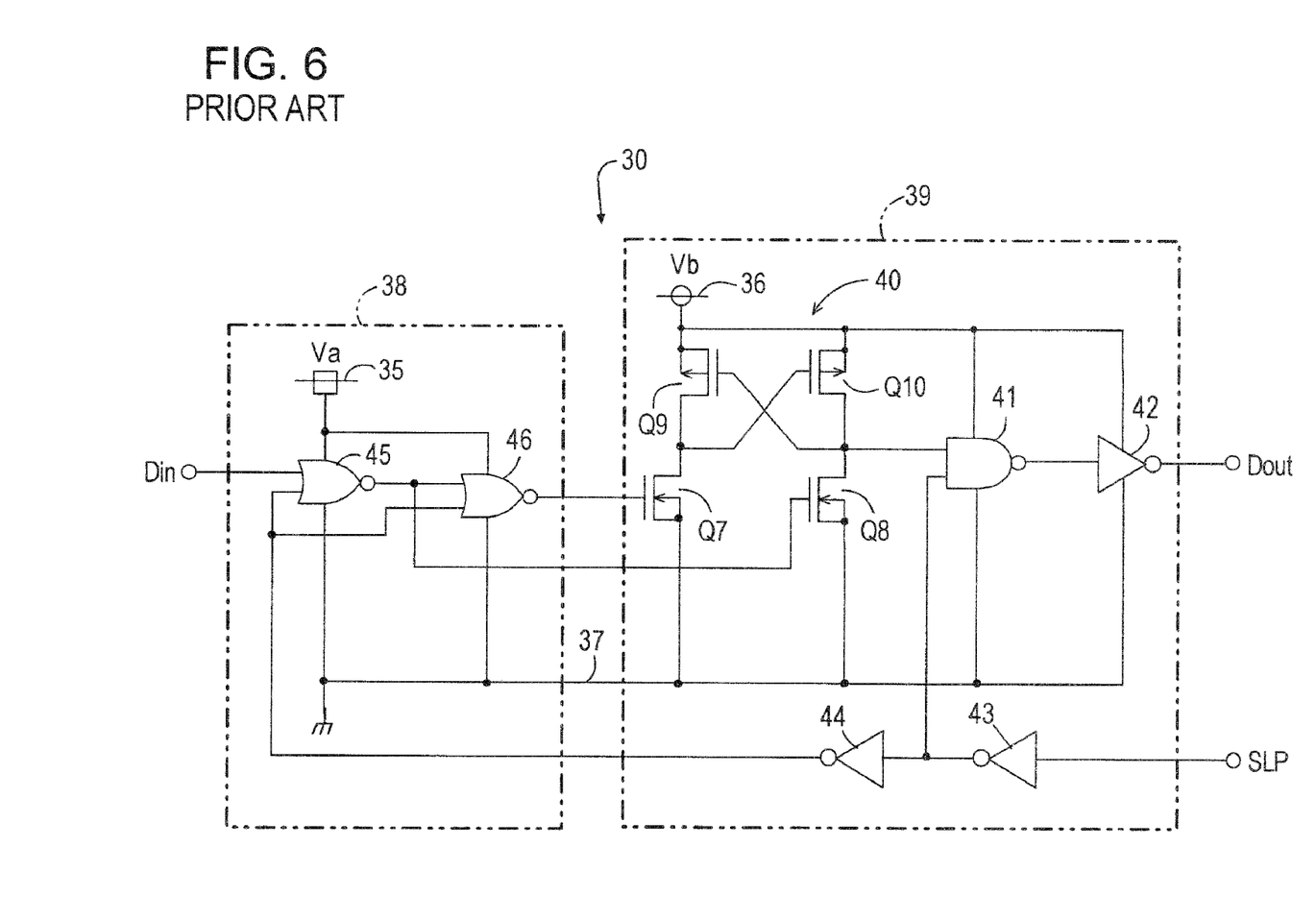
FIG. 6 is a circuit diagram showing a conventional level shift circuit having a standby function, analyzed in the light of present invention for reference.
Figure 8:
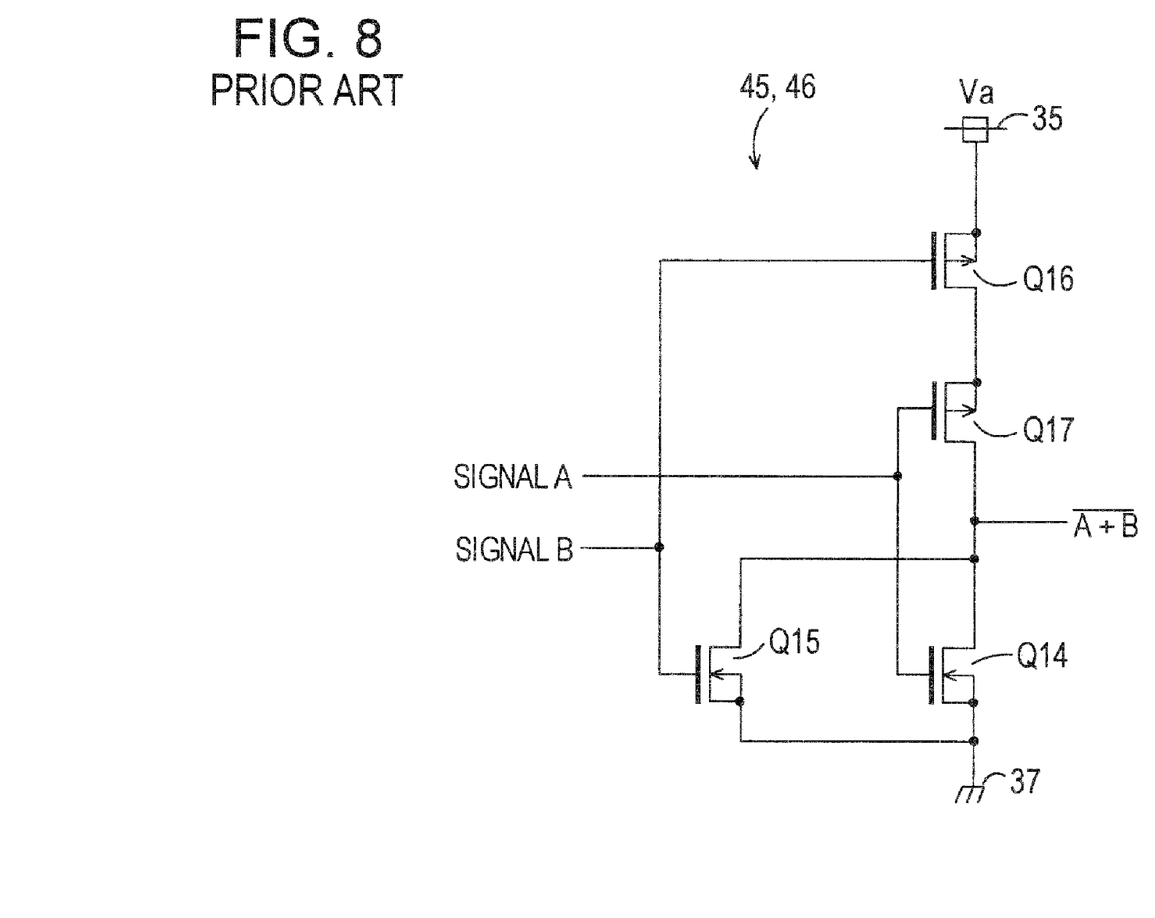
FIG. 8 is a circuit diagram at the transistor level of NOR gates 45, 46 in FIG. 6.

The formulation of the conventional level shifter circuit, shown in Patent Document 1, is now described with reference to FIGS. 6 and 8. A level shift circuit 30 is made up of circuit blocks 38 and 39. The circuit block 38 is run in operation as it is fed with the voltage of a power supply Va over a power supply line 35. The circuit block 39 is run in operation as it is fed with the voltage of a power supply Vb over a power supply line 36 and as it receives a signal from the circuit block 38. Meanwhile, the circuit blocks 38, 39 are connected common to a ground line 37 as a reference voltage of the power supply voltages Va and Vb. In the circuit block 39, a level converter circuit 40 is formed by N-channel MOS transistors Q7, Q8 and P-channel MOS transistors Q9, Q10. The transistors Q7, Q8 have sources connected to the ground line 37. The transistor Q9 is connected between the power supply line 36 and the transistor Q7, while the transistor Q10 is connected between the power supply line 36 and the transistor Q8. The transistor Q9 has a gate connected to the drain of the transistor Q8, while the transistor Q10 has a gate connected to the drain of the transistor Q7. The drains of the transistors Q8, Q10 serve as an output terminal of the level converter circuit 40. An output signal of the level converter circuit 40 is delivered as Dout via a NAND gate 41, operating as a level determining circuits and via an inverter 42. A sleep signal SLP is delivered via inverters 43, 44 to the circuit block 38, while being delivered via inverter 43 to the NAND gate 41 to operate as a level determining control signal for the NAND gate 41. On the other hand, in the circuit block 38, an input signal Din and the sleep signal SLP from the inverter 44 are delivered to a NOR gate 45, while an output signal of the NOR gate 45 and the sleep signal SLP are delivered to a NOR gate 46. Output signals of the NOR gates 45, 46 are delivered to the gates of the transistors Q8, Q7, respectively. FIG. 8 shows an inner circuit of the each of the NOR gates 45, 46. These NOR gates 45, 46 are each formed by N-channel MOS transistors Q14, Q15 and P-channel MOS transistors Q16, Q17.

The operation of the level shift circuit 30 is now described. During the normal operation, the sleep signal SLP is at LOW level. Hence, the output signals of the inverters 43, 44 are respectively at HIGH level and LOW level, with the NAND gate 41 and the NOR gates 45, 46 operating as inverters. If the input data Din is at LOW level (0V), the transistors Q7, Q10 are off, while the transistors Q8, Q9 are on, with the circuit block 39 providing data Dout at LOW level (0V). On the other hand, if the input data Din is at HIGH level (voltage Va), the transistors Q7, Q10 are on, while the transistors Q8, Q9 are off, with the circuit block 39 delivering the data Dout at HIGH level (voltage Vb).

During the stand-by time, the sleep signal SLP is brought HIGH. A power supply circuit, not shown, ceases generation and outputting of the power supply voltage Va. At this time, the output signals of the inverters 43, 44 in the level shift circuit 30 are brought LOW and HIGH, respectively. Since the NOR gates 45, 46 of the circuit block 38 are of the circuit configuration shown in FIG. 8, one of the transistors Q14, Q15 is turned on as long as the output signal of the inverter 44 is kept HIGH, even in case the power supply voltage Va is turned off, thus outputting a LOW level signal. This causes the transistors Q7, Q8 of the level converter circuit 40 to be turned off to inhibit the tunneling current that might otherwise flow from the power supply line 36 via transistors Q9, Q7 to the grounding line 37 as well as the tunneling current that might otherwise flow from the power supply line 36 via transistors Q10, Q8 to the grounding line 37. At this time, the output of the level converter circuit 40 sees a high impedance and is at an indefinite level. However, the NAND gate 41 delivers an output signal fixed at a HIGH level without dependency upon the output signal level of the level converter circuit 40. Hence, the circuit block 39 is able to output the data Dout fixed at LOW level (0V).

[Patent Document 1] JP Patent Kokai Publication No. JP-P2006-173889A

SUMMARY

The entire disclosure of Patent Document 1 is incorporated herein by reference thereto.

The following analyses are given by the present invention.

However, investigations by the present inventors have revealed that, with this conventional level shift circuit with the standby function, malfunctioning signals may be output on standby disengagement depending on the manner of using the circuit. The reason is now described with reference to the timing chart of FIG. 7.

Figure 7:
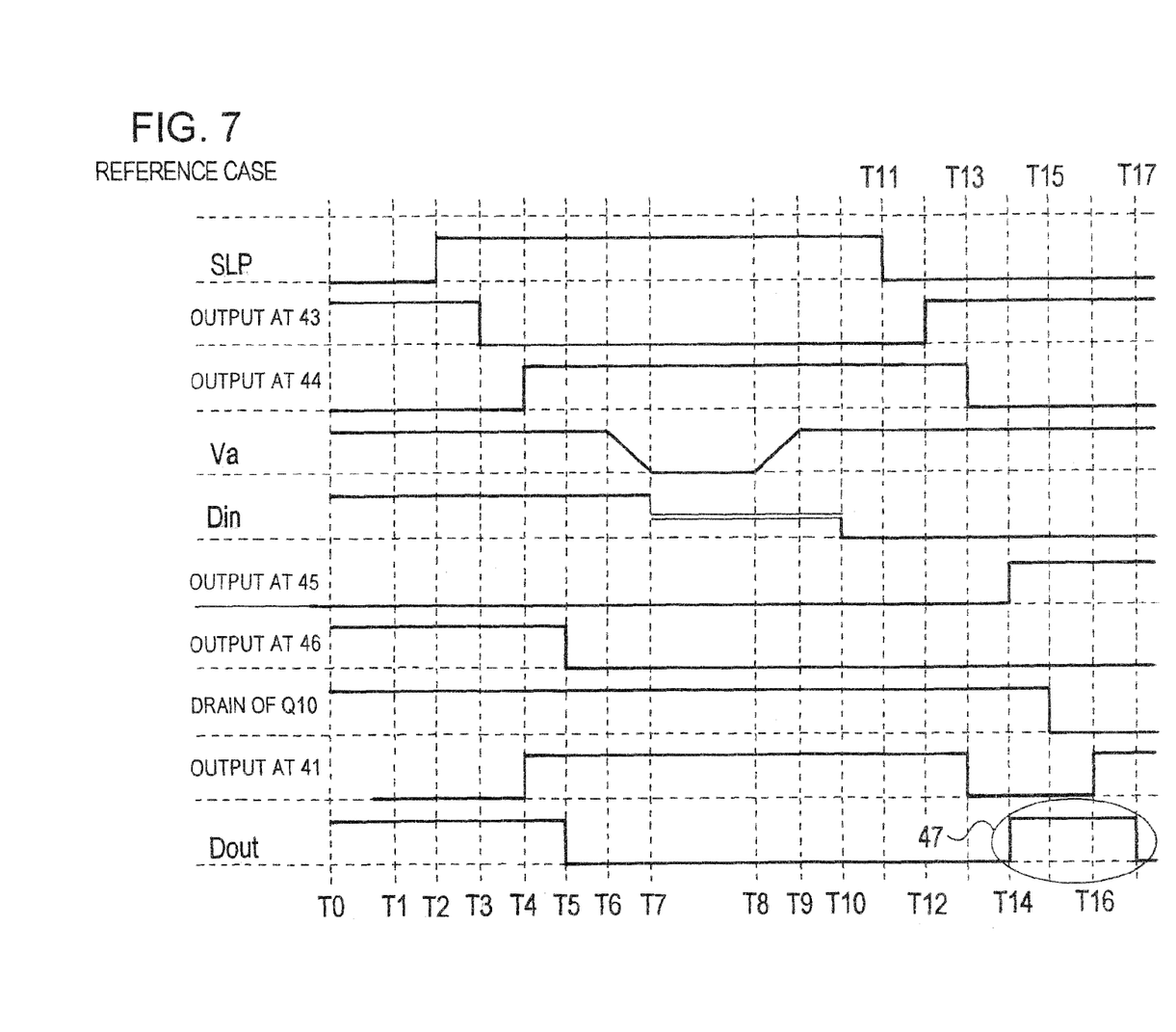
FIG. 7 is a timing chart of the level shift circuit having a standby function shown in FIG. 6.

In the timing chart of FIG. 7, a time interval from time T0 until time T2 stands for the operation before entering the standby state, and a time interval from time T2 until time T7 stands for the operation when entering the standby state. A time interval from time T7 until time T8 stands for the operation during the standby operation, and a time interval from time T8 until time T17 stands for the operation until the standby state is fully disengaged. Since it is the operation of disengaging the standby state that is especially of a problem, the operation at the time of disengaging the standby state is now described in detail.

During the standby state since time T7 until time T8, the power supply Va for the NOR gates 45, 46 is turned off. However, an output of the inverter 44 is kept at HIGH level. Hence, the gate voltages of the N-channel MOS transistors Q7, Q8 are substantially at 0V. On the other hand, the gates and the drains of the P-channel MOS transistors Q9, Q10 are cross-coupled to each other. Hence, the voltage at the drain of the P-channel MOS transistor Q10 is not lower than a voltage equal to the power supply voltage Vb less the threshold voltage of the P-channel MOS transistor Q10. That is, the voltage at the drain of the P-channel MOS transistor Q11 is approximately at a HIGH level, even granting that the drain voltage of the P-channel MOS transistor Q10 is not of a fully HIGH level due to variations in the off-currents of the N-channel MOS transistors Q7, Q8 and the P-channel MOS transistors Q9, Q10.

The standby disengaging operation is initiated as from time T8. Initially, the power supply Va is turned on. The potential of the power supply Va is definitive at time T9. Since the power supply voltage in a chip has been made definitive, the logic state in the chip is definitive and, at time T10, the logic state of the input data Din is definitive. With the above related technique, the logic state is fixed at a LOW level. After the power supply voltage Va and the level of the input data Din have been made definitive in this manner, the sleep signal SLP shifts to the LOW level to initiate the standby disengagement operation. The logic states of the outputs of the inverters 43, 44 are definitive after respective time delays at time T12 and time T13, respectively. When the output of the inverter 43 has transitioned to the high level at time T12, the NAND gate 41 transmits the logic state of the drain of the transistor Q10 to the downstream side. Since the logic state of the transistor Q10 is substantially at the HIGH level, the output of the NAND gate 41 is at LOW level, at time T13, with the output of the inverter 42, that is, the output data Dout, being at HIGH level.

After the outputting operation of the inverter 44 has come to a close, the output of the NOR gate 45 transitions to a HIGH level at time T14. At this time T14, the logic states of the NOR gates 45, 46 are complementary to each other and operated normally as logic states to be entered to the transistors Q9, Q10 of the level converter circuit 40. The drain of the transistor Q10 is brought LOW at time T15. In similar manner, the output of the NAND gate 41 transitions to a HIGH level, with the output data Dout transitioning to a LOW level.

The operation of the conventional circuit is now put into order. The standby state is set with the HIGH logic state of the input data Din. If the operating state of the present circuit is such that the logic state of the input data Din is at LOW level when restoring from the standby state, the output state is at LOW level, then at HIGH level and then at LOW level. With the present circuit of the related technique, an expected operation is such that, when restoring from the standby state, a LOW level is input as input data Din, with the output data Dout being at LOW level. However, the value of the output data Dout transitions to a LOW level, then to a HIGH level and then to a LOW level, as indicated at 47. This is a mistaken operation. The mistaken operation signal 47 affects the circuit arrayed on the downstream side of the level shift circuit in the system. Thus there is much to be desired in the art.

In one aspect, the present invention provides a level shift circuit for transmitting a signal from a circuit operated by a first power supply to another circuit operated by a second power supply. The level shift circuit comprises a level converter circuit, a barrier gate circuit and a holding circuit. The level converter circuit comprises: a first transistor of a first conductivity type having a source and a drain connected between the second power supply and a first output terminal and having a gate connected to a second output terminal; a second transistor of the first conductivity type having a source and a drain connected between the second power supply and the second output terminal and having a gate connected to the first output terminal; a first transistor of a second conductivity type having a source grounded and having a drain connected to the first output terminal; and a second transistor of the second conductivity type having a source grounded and having a drain connected to the second output terminal. The barrier gate circuit receives an input signal of a first power supply system and outputs a gate signal of the first transistor of the second conductivity type and a gate signal of the second transistor of the second conductivity type. The barrier gate circuit receives a standby signal to set the first and second transistors of the second conductivity type to off-states. The holding circuit holds the first and second output terminals at a constant voltage when the first and second transistors of the second conductivity type are both in the off-state.

The meritorious effects of the present invention are summarized as follows.

The level shift circuit according to the present invention includes the barrier gate circuit and the holding circuit. The barrier gate circuit receives a standby signal to turn off the first and second transistors of the second conductivity type, which are input transistors of a level converter circuit. The holding circuit holds the first and second output terminals at a constant voltage when the first and second transistors of the second conductivity type are both in the off states. It is unnecessary to provide a level determining circuit downstream of the level converter circuit, while there is no fear that a malfunctioning signal is output when disengaging the standby state.

PREFERRED MODES

The level shift circuit according to one mode of the present invention transmits a signal from a circuit operated by a first power supply, e.g., VDD1, to another circuit operated by a second power supply, e.g., VDD2. The level shift circuit includes a level converter circuit, such as 5, 6 or 7, a barrier gate circuit, such as 2, and a holding circuit, such as MMP1-MMP2, or MMN11-MMN12, or MMN7-MMN8 and MMP9-MMP10.

The level converter circuit may include a first transistor of the first conductivity type, such as MMP3, a second transistor of the first conductivity type, such as MMP4, a first transistor of the second conductivity type, such as MMN1, and a second transistor of the second conductivity type, such as MMN2. The first transistor of the first conductivity type has a source and a drain connected between the second power supply and the first output terminal, such as Y, while having a gate connected to a second output terminal, such as YB. The second transistor of the first conductivity type has a source and a drain connected between the second power supply and the second output terminal, while having a gate connected to the first output terminal. The first transistor of the second conductivity type has a source grounded, while having a drain connected to the first output terminal. The second transistor of the second conductivity type has a source grounded, while having a drain connected to the second output terminal.

The barrier gate circuit may receive an input signal, such as A, of the first power supply system, to output a gate signal, such as AB, of the first transistor of the second conductivity type, and a gate signal, such as ABB, of the second transistor of the second conductivity type. The barrier gate circuit may receive a standby signal to set both the first and second transistors of the second conductivity type of the level converter circuit to off-states.

The holding circuit may hold the first and second output terminals at a constant voltage when the first and second transistors of the second conductivity type are both in off-states.

The present invention will now be described with reference to Exemplary embodiments shown in the drawings.

Figure 1:
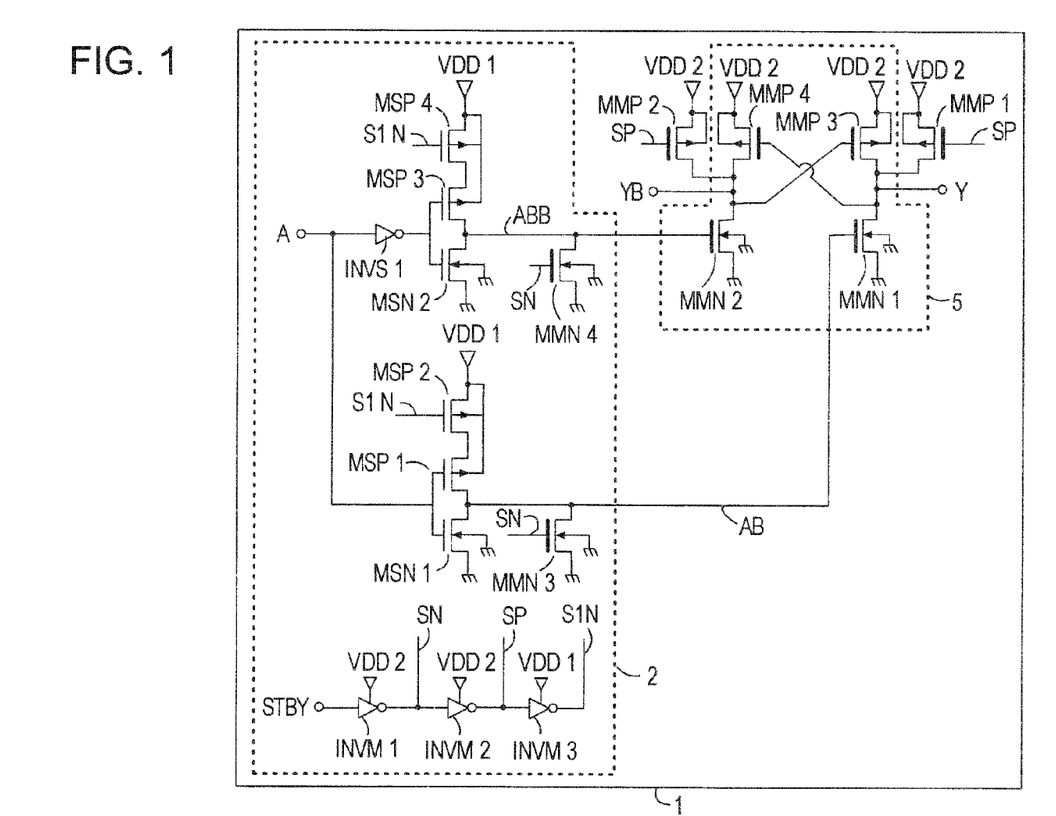
FIG. 1 is a circuit diagram showing a level shift circuit having a standby function according to Exemplary embodiment 1 of the present invention.

FIG. 1 depicts a circuit diagram of a level shift circuit having a standby function 1 according to an Exemplary embodiment of the present invention. In FIG. 1, the level shift circuit having a standby function 1 is made up of a barrier gate circuit 2, a level converter circuit 5 and high breakdown voltage P-channel MOS transistors MMP1, MMP2, the drains of which are respectively connected to output signals Y and YB of the level converter circuit 5. Meanwhile, in FIG. 1, high breakdown voltage transistors or inverters are indicated by their gates being shown with thick lines for distinction from the low breakdown voltage transistors or inverters. Specifically, the low breakdown voltage transistors are N-channel transistors MSN1, MSN2 and P-channel transistors MSP1, MSP2, MSP3 and MSP4. The inverter INVS1 is also formed by a low breakdown voltage transistor. The power supply voltage is a first power supply VDD1.

On the other hand, the high breakdown voltage transistors are high breakdown voltage N-channel transistors MMN1, MMN2, MMN3 and MMN4 and high breakdown voltage P-channel MOS transistors MMP1, MMP2, MMP3 and MMP4. Inverters INVM1, INVM2 and INVM3 are also formed by high breakdown voltage transistors. Meanwhile, the power supply voltage of the inverters INVM1 and INVM2, out of the inverters formed by high breakdown voltage transistors, is a second power supply VDD2. The power supply voltage of the inverter INVM3 is a first power supply VDD1.

The barrier gate circuit 2 is made up of N-channel transistors MSN1 and MSN2, high breakdown voltage N-channel MOS transistors MMN3 and MMN4, P-channel MOS transistors MSP1, MSP2, MSP3 and MSP4, inverters INVM1 to INVM3 and an inverter INVS1. The barrier gate circuit 2 receives an input signal A and a standby signal STBY and outputs signals ABB, AB, SN and SP.

The level converter circuit 5 is made up of the high breakdown voltage N-channel MOS transistors MMN1 and MMN2 and the high breakdown voltage P-channel MOS transistors MMP3 and MMP4.

In the barrier gate circuit 2, the inverter INVM1 inverts a standby signal STBY to output a signal SN of a level of the second power supply VDD2. The inverter INVM2 inverts the signal SN to output a signal SP having an amplitude width of the level of the second power supply VDD2. The inverter INVM3 inverts the signal SP to output a signal S1N having an amplitude width of a level of the first power supply VDD1.

The gate and the drain of the N-channel transistor MSN1 are coupled to the input signal A and to the signal AB, respectively. The source and the backgate of the N-channel transistor MSN1 are coupled to the GND potential. The P-channel transistor MSP1 has a gate coupled to the input signal A, while having a drain connected to the signal AB. The source and the backgate of the P-channel transistor MSP1 are respectively coupled to the drain of the transistor MSP2 and to the first power supply VDD1. The P-channel transistor MSP2 has a gate coupled to the signal S1N, while having a source and a backgate commonly coupled to the first power supply VDD1. The high breakdown voltage N-channel transistor MMN3 has a gate coupled to the signal SN and has a drain coupled to the signal AB, while having a source and a backgate coupled to the GND potential.

The inverter INVS1 inverts the output signal A to output a signal of the level of the first power supply VDD1. An output terminal of the inverter INVS1 is connected to the gates of the N-channel transistor MSN2 and the P-channel transistor MSP3.

The N-channel transistor MSN2 has a drain connected to the signal ABB, while having a source and a backgate connected to the GND potential. The P-channel transistor MSP3 has a drain connected to the signal ABB, while having a source connected to a drain of the P-channel transistor MSP4 and having a backgate connected to the first power supply VDD1. The P-channel transistor MSP4 has a gate coupled to the signal S1N, while having a source and a backgate connected to the first power supply VDD1. The high breakdown voltage N-channel transistor MMN4 has a gate connected to the signal SN, while having a drain coupled to the signal ABB. The source and the backgate of the high breakdown voltage N-channel transistor MMN4 are coupled to the GND potential.

In the level converter circuit 5, the signal AB, output from the barrier gate circuit 2, is coupled to the gate of the high breakdown voltage N-channel transistor MMN1. This high breakdown voltage N-channel transistor has a drain coupled to the output signal Y, while having a source and a backgate connected to the GND potential. The signal ABB, output from the barrier gate circuit 2, is coupled to a gate of the high breakdown voltage N-channel transistor MMN2 which has a drain coupled to the output signal YB, while having a source and a backgate connected to the GND potential. The high breakdown voltage P-channel transistor MMP3 has a gate coupled to the output signal YB, while having a drain coupled to the output signal Y. The high breakdown voltage P-channel transistor MMP4 has a gate coupled to the output signal Y, while having a drain connected to the output signal YB.

The sources and the backgates of the high breakdown voltage P-channel transistors MMP3, MMP4 are connected to the second power supply VDD2.

The high breakdown voltage P-channel transistor MMP1 has a gate coupled to the signal SP, while having a drain coupled to the output signal Y. The high breakdown voltage P-channel transistor MMP2 has a gate coupled to the signal SP, while having a drain coupled to the output signal YB. The sources and the backgates of the high breakdown voltage P-channel transistors MMP1 and MMP2 are connected to the second power supply VDD2.

Let it be assumed that the voltage value of the first power supply VDD1 is 1.2V and that of the second power supply VDD2 is 3.3V. The level shift circuit of the present Exemplary embodiment converts the level of the input signal A of the signal amplitude of the level of the first power supply VDD1 to a positive logic output signal Y of a signal amplitude of the level of the second power supply VDD2 and to a negative logic output signal YB of a signal amplitude of the level of the second power supply VDD2. The standby signal STBY has a signal amplitude of the level of the second power supply VDD2 and operates for switching between the normal operation and the standby operation of the level shift circuit.

Figure 2:
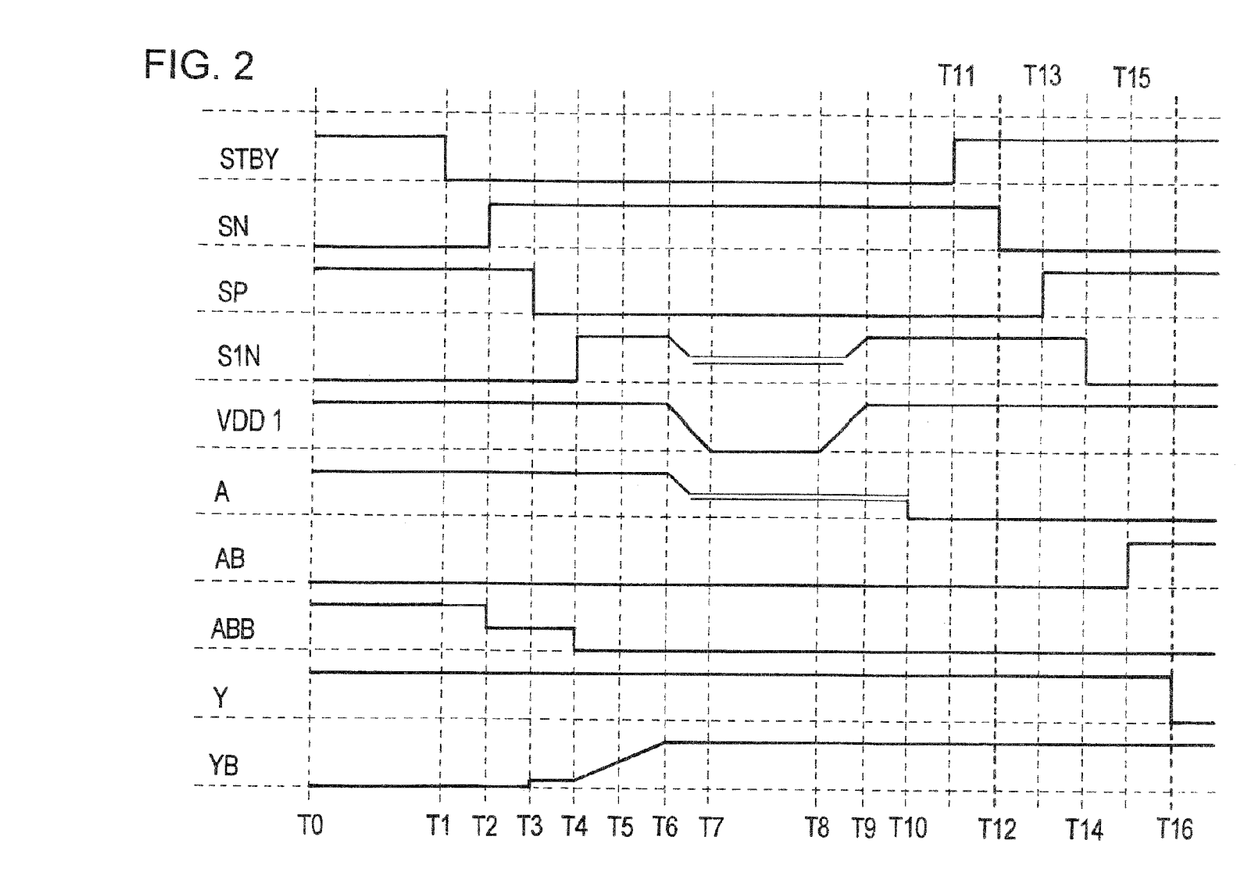
FIG. 2 is a timing chart of the level shift circuit having a standby function according to Exemplary embodiment 1 of the present invention.

The operation of the level shift circuit with a standby function of the Exemplary embodiment shown in FIG. 1 is now described. FIG. 2 depicts a timing chart illustrating its operation.

<Operation for Transition to Standby Mode>

At time T1, the standby signal STBY takes on a Low level. The logic states of the inverters INVM1 to INVM3 are inverted immediately after delay. At time T2, the logic state of the inverter INVM1 is inverted after its time delay, such that the signal SN is brought HIGH. At time T3, the logic state of the inverter INVM2 is inverted after its time delay, such that the signal SP is brought LOW. At time T4, the logic state of the inverter INVM3 is inverted after its time delay, such that the signal S1N is brought HIGH. Thus, the potentials of the signals SN, SP and S1N are definitive at time T4.

The pull-down operation for the signal ABB commences after logic state inversion of the signal SN at time T2. At time T4, the logic state of the signal S1N is inverted. This causes the gates of the P-channel transistors MSP2, MSP4 to go HIGH to turn off the transistors. Hence, the signal ABB is fully at a LOW level, The signal AB is already at a LOW level at time T1, and continues to be kept at the LOW level as from time T1 until time T7, without being affected by the operation of the signals SN, SP or S1N.

Since the signals AB and ABB are both LOW as from time T4, the high breakdown voltage N-channel transistors MMN1 and MMN2 of the level converter circuit 5 are off as from time T4.

On the other hand, the high breakdown voltage P-channel transistors MMP1, MMP2 are turned on responsive to SP going LOW at time T3 to commence a pull-up operation. Hence, the HIGH level of the output signal YB is determined at time T6. The output signal Y is already at HIGH level at time T1, and continues to be kept at the HIGH level as from time T1 through time T7 without being affected by the signals SN, SP or S1N.

At time T6, the main circuit completes its preparation (i.e., gets ready) for entering into the standby state. The first power supply VDD1 starts to be turned off such that its potential is lowered gradually. At time T7 when the first power supply VDD1 has been lowered to a certain extent, the input signal A becomes indefinite. At the same time, the signal S1N, whose power supply voltage is the level of the first power supply VDD1, also becomes indefinite.

The signal SN, generated by the inverter INVM1, whose power supply voltage is the second power supply VDD2, is kept HIGH. Thus, the high breakdown voltage N-channel transistors MMN3, MMN4, whose gates receive the signal SN, are kept in on-states, so that the signals ABB and AB are pulled down and kept at the GND potential. On the other hand, at time T6 and time T7 when the power supply voltage is being lowered, the HIGH level of the signal S1N continues to be delivered to the gates of the P-channel transistors MSP2 and MSP4 by the inverter INVM3, since the signal SP is at LOW level. Thus, Vgs of the P-channel transistor MSP4 and that of the P-channel transistor MSP2 continue to be maintained at 0V. After time T7, the power supply VDD1 is turned off, so that the P-channel transistors MSP4 and MSP2 are not turned on. Hence, P-channel transistors MSP4 and MSP2 are off in a stable state. The signals AB and ABB are maintained at all times at LOW level during the time as from time T6 through time T9, which is the time period for deactivation and reactivation of power supply, by the operation of the high breakdown voltage N-channel transistors MMN3 and MMN4 and the high breakdown voltage P-channel transistors MSP4 and MSP2.

<Power Supply Activation>

The operation of activating the first power supply VDD1 commences at time T8. The input signal SP of the inverter INVM3 is at LOW level and is kept at the LOW level even during transition of the first power supply VDD1. The inverter INVM3 thus outputs the same HIGH level as that of the first power supply VDD1 as soon as the potential of the first power supply VDD1 rises to a value high enough to permit the outputting of the HIGH level. Since the sources and the gates of the P-channel transistors MSP4 and MSP2 are at the same potential, these transistors are not turned on during the operation of activation of the first power supply VDD1. Hence, the logic states of the signals AB and ABB are maintained in stability at the LOW level.

<Operation of Standby Release (Deactivation)>

When the potential of the first power supply VDD1 has been made definitive at time T9, the internal logic of the chip is definitive. Hence, the potential of the signal A becomes definitive at time T10 For the present description, the potential of the signal A is presumed to be LOW, After the signal level of the signal A has been made definitive, the operation of standby release commences. At time T11, the standby signal STBY is brought HIGH. The logic states of the inverters INVM1 to INVM3 are inverted after preset delay time inherent to the inverters INVM1 to INVM3. At time T12, the logic state of the inverter INVM1 is inverted after a preset delay time, with the signal SN then going LOW. At time T13, the logic state of the inverter INVM2 is inverted after a preset delay time, with the signal SP then going HIGH. At time T14, the logic state of the inverter INVM3 is inverted after preset delay time, with the signal S1N then going LOW. Hence, at time T14, the potentials of the signals SN, SP and S1N are determined.

After falling of the signal S1N at time T14, the P-channel transistor MSP2 is turned on to cause the signal AB to go HIGH at time T15. At this time, the signals AB and ABB are in the logic states inverted to each other as during the normal operation. Thus, after the operation of the level shift circuit, the output signal Y at LOW level is output at time T16. During the operation, the signal ABB is kept at LOW level, and hence the high breakdown voltage N-channel transistor MMN2 is off at all times. Thus, the output signal YB is kept at the potential to which it has been pulled up by the high breakdown voltage P-channel transistor MMP2 during the standby operation. Hence, the potential of the output signal YB is maintained at all times at the HIGH level during the standby release operation.

As regards the above-described sequence of operations, the logical states of the signals AB and ABB may be LOW and HIGH or HIGH and LOW, or those of the output signals Y and YB may also be LOW and HIGH or HIGH and LOW, depending on the logic state of the input signal A at time T1 before the standby operation or that after time T10. However, the relationship of interdependence of the operations or the scheme of determining the logic states remains unchanged from that described above.

With the present Exemplary embodiment, a circuit apparatus including the level converter circuit has an output part that generates signals AB, ABB controlling the level converter circuit. The output part includes P-channel transistors MMP1, MMP2, as pull-up drivers, operating with the second power supply potential, and N-channel transistors MMN1, MMN2, as pull-down drivers, operating with the second power supply potential, and which are coupled to the signals AB, ABB which control the level converter circuit. The output part also includes transistors MMN3, MMN4 that generate signals controlling the gates of the N-channel transistors for pull-down and that operate with the first power supply, and P-channel transistors MMP3, MMP4, as pull-up drivers, operating with the second power supply potential, and which are respectively coupled to the output signals Y and YB of the level converter circuit. The signal SP controls the gates of the pull-up P-channel transistors (MMP1, MMP2) which are operated with a second power supply potential (VDD2).

Thus, when turning off the power supply or again turning on the power supply for restoration, the output logic state may be determined by the operation of the level converter circuit itself. Thus, the output state of the level converter circuit itself is not indefinite, so that there is no necessity of providing a level determining circuit downstream of the level converter circuit. That is, there is no fear of malfunctions otherwise caused by delay in the operation of the level converter circuit brought about by standby release (deactivation) of the level determining circuit. In addition, there is no fear of signal delay otherwise caused by providing the level determining circuit, unneeded for level shifting during the normal operation, on the downstream side of the level converter circuit.

In the present Exemplary embodiment, high breakdown voltage transistors are used as N-channel MOS transistors (MMN3, MMN4) that pull down the input signals AB, ABB delivered to the level converter circuit 5, and the standby signal SN of the VDD2 system is input to the gate of each of these transistors. It is thus possible to pull down the input signals positively even in case of turning off the power supply of the VDD1 system.

The power supply of an inverter that drives the input signals AB and ABB is supplied via low breakdown voltage P-channel MOS transistors MSP2, MSP4, to the gates of which are delivered the standby signals S1N of the VDD1 system. That is, since high breakdown voltage transistors are not used as the power supply of the inverter that drives the input signals AB, ABB, it is possible to avoid signal delay or increased layout areas otherwise caused by using the high breakdown voltage transistors.

The inverter INVM3, generating the standby signal S1N of the VDD1 system, is an inverter of the VDD1 system. However, the inverter receives an inverted signal of the standby signal of the VDD2 system, and is constituted by a high breakdown voltage transistor. Hence, there is no risk of outputting the standby signal S1N of the VDD1 system of a mistaken logic state even on activation start (rising start) of the VDD1 power supply. The input signals AB, ABB can be steadily kept at LOW level unless the standby signal is released (canceled)

Exemplary Embodiment 2

Figure 3:
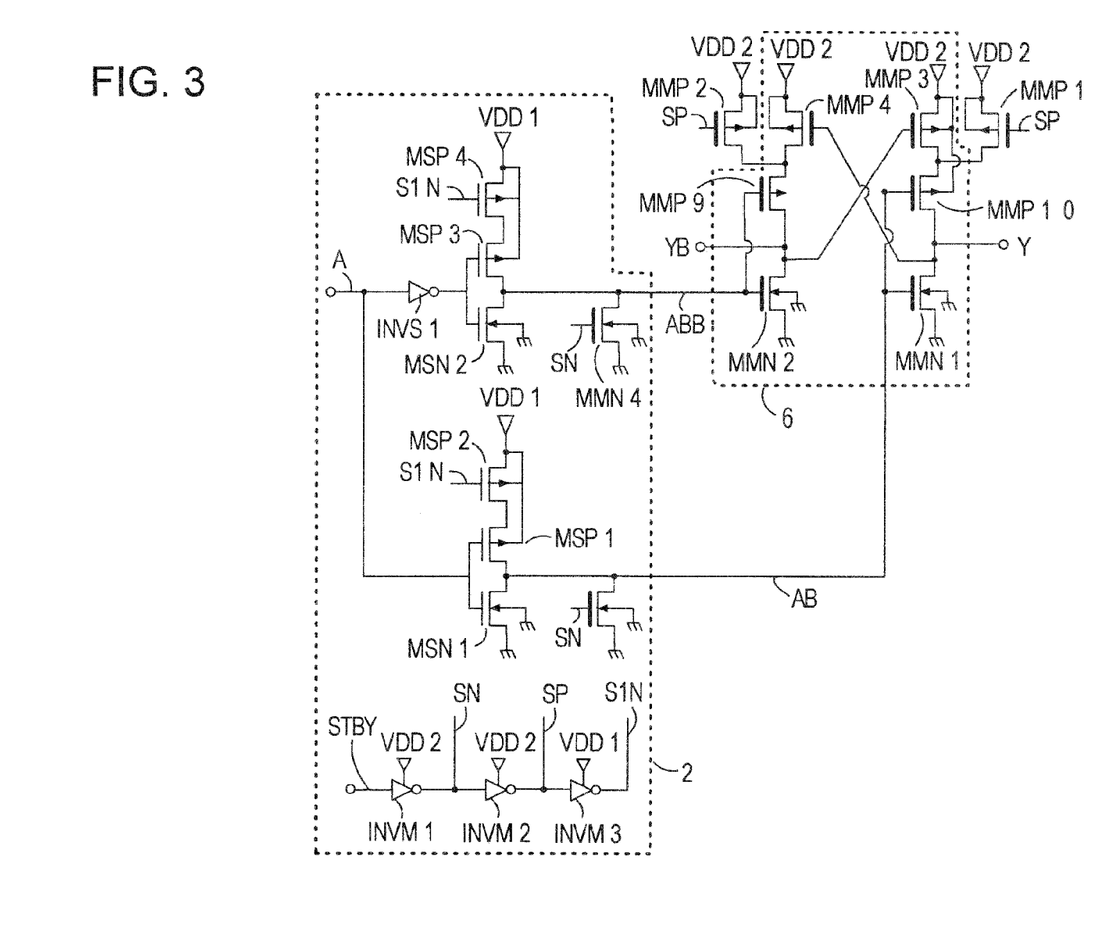
FIG. 3 is a circuit diagram showing a level shift circuit having a standby function according to Exemplary embodiment 2 of the present invention.

An arrangement of Exemplary embodiment 2 of the present invention is now described with reference to FIG. 3. Those parts or components which are the same as those of Exemplary embodiment 1 are depicted with the same reference numerals or symbols, and the corresponding description is dispensed with.

In the present Exemplary embodiment, the level converter circuit 5 of Exemplary embodiment 1 is changed to a level converter circuit 6. The high breakdown voltage P-channel transistors MMP1 MMP2, that pull up the output signals Y, YB of the level converter circuit in Exemplary embodiment 1, are constituted as pull-up drivers for the level converter circuit. The level converter circuit 6 is made up of high breakdown voltage N-channel transistors MMN1, MMN2, and high breakdown voltage P-channel transistors MMP3, MMP4, MMP9 and MMP10.

In the level converter circuit 6, the signal ABB is coupled to the gates of the high breakdown voltage N-channel transistor MMN2 and the high breakdown voltage P-channel transistor MMP9. The drains of the high breakdown voltage N-channel transistor MMN2 and the high breakdown voltage P-channel transistor MMP9 are coupled together and coupled to the output signal YB. The source and the backgate of the high breakdown voltage N-channel transistor MMN2 are connected to the GND potential. The high breakdown voltage P-channel transistor MMP9 has a source connected to a drain of the high breakdown voltage P-channel transistor MMP4, which has a backgate connected to the second power supply VDD2. The high breakdown voltage P-channel transistor MMP4 has a gate coupled to the output signal Y of the level converter circuit 6, while having a source and a backgate connected to the second power supply VDD2.

The signal AB is coupled to the gates of the high breakdown voltage N-channel transistor MMN1 and the high breakdown voltage P-channel transistor MMP10. The drains of the high breakdown voltage N-channel transistor MMN1 and the high breakdown voltage P-channel transistor MMP10 are connected together and coupled to the output signal Y. The source and the backgate of the high breakdown voltage N-channel transistor MMN1 are connected to the GND potential. The high breakdown voltage P-channel transistor MMP10 has a source connected to the drain of the high breakdown voltage P-channel transistor MMP3, which has a backgate connected to the second power supply VDD2. The high breakdown voltage P-channel transistor MMP3 has a gate coupled to the output signal YB of the level converter circuit 6, while having a source and a backgate connected to the second power supply VDD2.

The high breakdown voltage P-channel transistor MMP2, as a pull-up driver, has a drain connected to the source of the high breakdown voltage P-channel transistor MMP9, and the signal SP is coupled to the gate of the high breakdown voltage P-channel transistor MMP2. The high breakdown voltage P-channel transistor MMP1 has a drain connected to the source of the high breakdown voltage P-channel transistor MMP10, and the signal SP is coupled to the gate of the high breakdown voltage P-channel transistor MMP1. The sources and the backgates of the high breakdown voltage P-channel transistor MMP1 and MMP2 are respectively connected to the second power supply VDD2. The barrier gate circuit 2 is the same as that of Exemplary embodiment 1. The operation of the output signals Y and YB of the level converter circuit for standby time is the same as that of Exemplary embodiment 1.

Exemplary Embodiment 3

Figure 4:
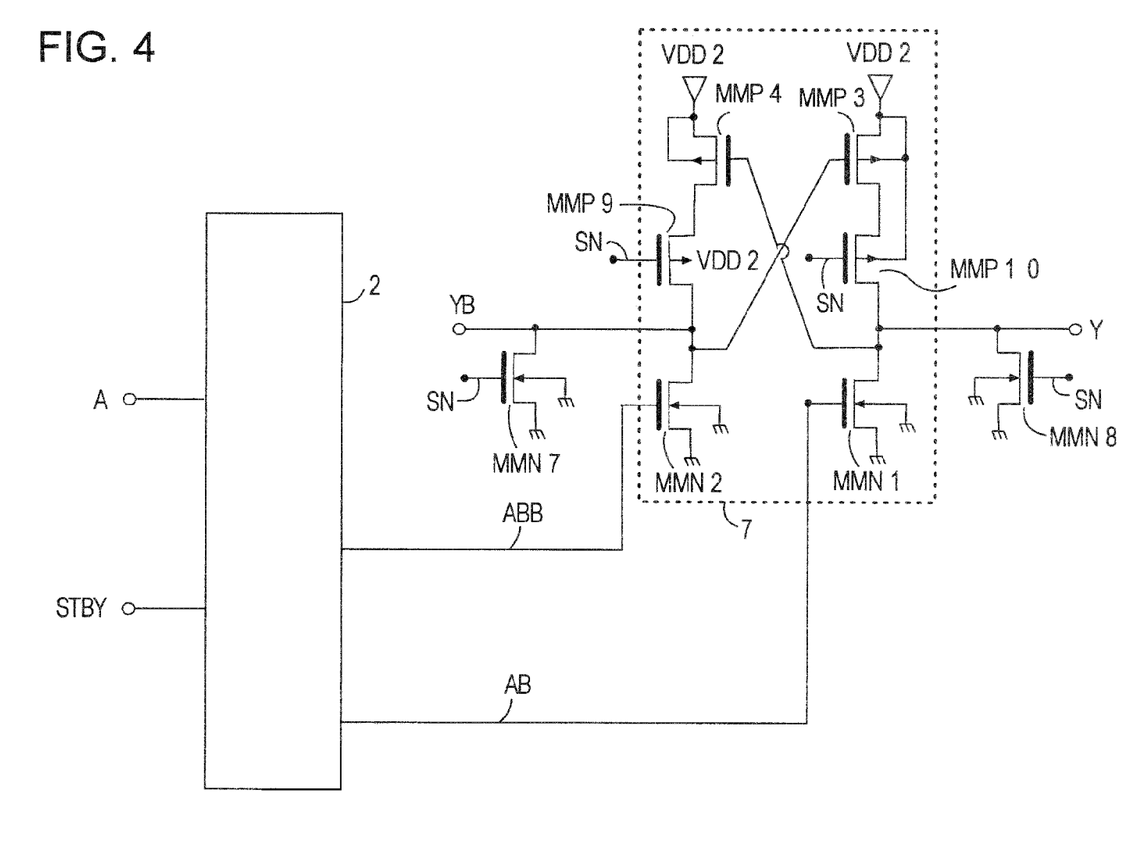
FIG. 4 is a circuit diagram showing a level shift circuit having a standby function according to Exemplary embodiment 3 of the present invention.

An arrangement of Exemplary embodiment 3 of the present invention is now described with reference to FIG. 4. Those parts or components which are the same as those of Exemplary embodiment 1 are depicted with the same reference numerals or symbols, and the corresponding description is dispensed with.

In Exemplary embodiment 3, the level converter circuit 5 of Exemplary embodiment 1 is changed to a level converter circuit 7. The high breakdown voltage P-channel transistors MMP1, MMP2 for pull-up, the drains of which are coupled to the output signals Y, YB of the level converter circuit, are not used. Instead, the high breakdown voltage N-channel transistors MMN7, MMN8 for pull-down, having drains coupled to the output signals Y, YB of the level converter circuit, are used.

The level converter circuit 7 includes the high breakdown voltage N-channel transistors MMN1, MMN2 and the high breakdown voltage P-channel transistors MMP3, MMP4, MMP9 and MMP10. The level converter circuit 7 also includes, for pull-down, the high breakdown voltage N-channel transistors MMN7 and MMN8.

In the level converter circuit 7, the signal ABB is coupled to the gate of the high breakdown voltage N-channel transistor MMN2. The drains of the high breakdown voltage N-channel transistor MMN2 and the high breakdown voltage P-channel transistor MMP9 are connected together and are coupled to the output signal YB. The source and the backgate of the high breakdown voltage N-channel transistor MMN2 are connected to the GND potential. The high breakdown voltage P-channel transistor MMP9 has a source connected to a drain of the high breakdown voltage P-channel transistor MMP4, while having a gate coupled to the signal SN. The backgate of the high breakdown voltage P-channel transistor MMP9 is connected to the second power supply VDD2. The high breakdown voltage P-channel transistor MMP4 has a gate coupled to the output signal Y of the level converter circuit 7, while having a source and a backgate connected to the second power supply VDD2.

The signal AB is connected to the gate of the high breakdown voltage N-channel transistor MMN1. The high breakdown voltage N-channel transistor MMN1 and the high breakdown voltage P-channel transistor MMP10 have drains connected together and connected to the output signal Y. The high breakdown voltage N-channel transistor MMN1 has a source and a backgate connected to the GND potential. The high breakdown voltage P-channel transistor MMP10 has a source connected to the drain of the high breakdown voltage P-channel transistor MMP3. The high breakdown voltage P-channel transistor MMP10 has a gate connected to the signal SN, while having a backgate coupled to the second power supply VDD2. The high breakdown voltage P-channel transistor MMP3 has a gate coupled to the output signal YB of the level converter circuit 7, while having a source and a backgate connected to the second power supply VDD2. The high breakdown voltage N-channel transistors MMN7 and MMN8 for pull-down have gates coupled to the signal SN, while having the backgate connected to the GND potential. The formulation of the barrier gate circuit 2 is the same as that of Exemplary embodiment 1.

Exemplary embodiment 3 differs from Exemplary embodiment 1 in that the output signal Y of the level converter circuit 7 is fixed at LOW level on power supply deactivation. However, Exemplary embodiment 3 may yield meritorious effects similar to those of Exemplary embodiment 1.

Exemplary Embodiment 4

Figure 5:
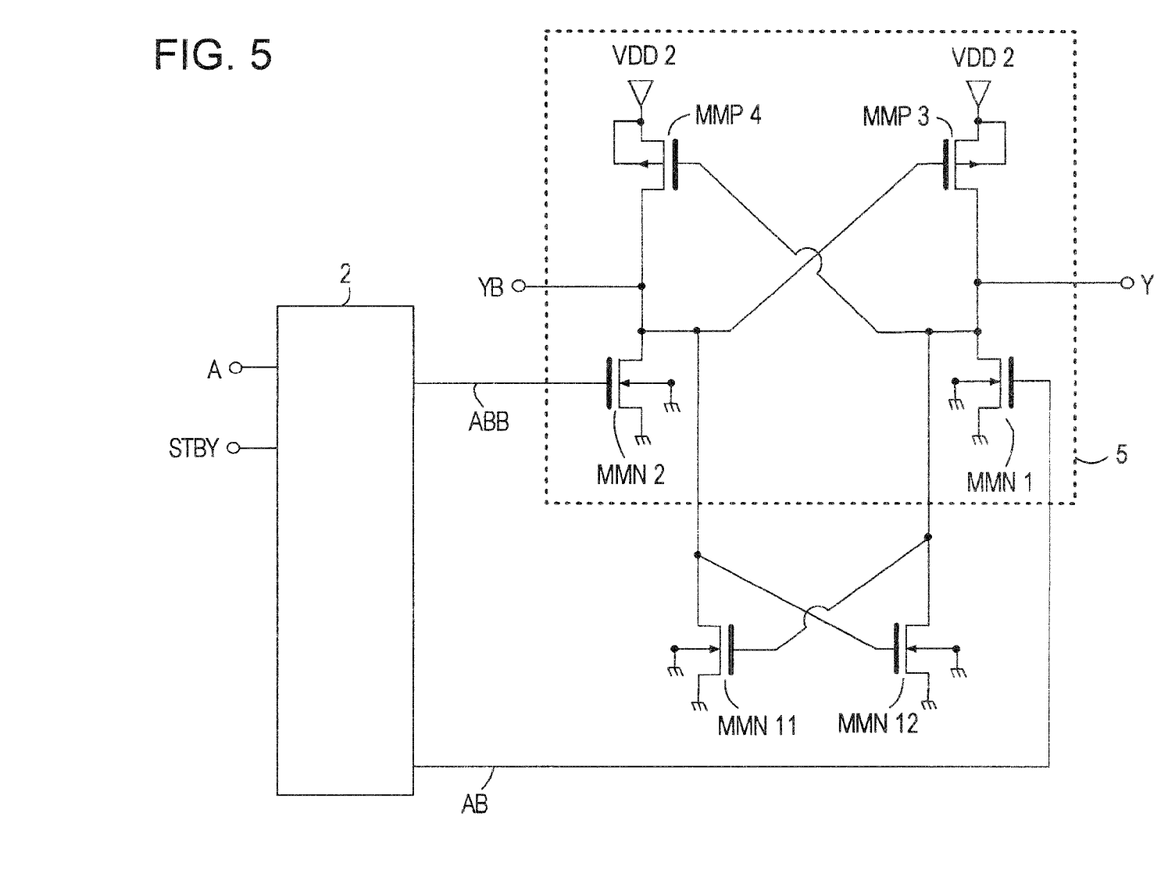
FIG. 5 is a circuit diagram showing a level shift circuit having a standby function according to Exemplary embodiment 4 of the present invention.

An arrangement of Exemplary embodiment 4 of the present invention is now described with reference to FIG. 5. Those parts or components which are the same as those of Exemplary embodiment 1 are depicted with the same reference numerals or symbols, and the corresponding description is dispensed with.

In Exemplary embodiment 4, the high breakdown voltage P-channel transistors MMP1, MMP2 for pull-up, the drains of which are respectively coupled to the output signals Y, YB of the level converter circuit, are not used. Instead, high breakdown voltage N-channel transistors MMN11, MMN12 for latching, having drains coupled respectively to the output signals Y, YB of the level converter circuit, are used. The high breakdown voltage N-channel transistors MMN11, MMN12 for latching have gates cross-coupled to respective drains, while having sources and backgates connected to the GND potential. The formulations of the barrier gate circuit 2 and the level converter circuit are the same as those of Exemplary embodiment 1.

Exemplary embodiment 4 differs from Exemplary embodiment 1 in that the logic state of the output signal Y of the level converter circuit is maintained on power supply deactivation. However, the meritorious effect similar to that of Exemplary embodiment 1 may be obtained.

The respective Exemplary embodiments, described above, may yield a meritorious effect that no malfunctions are produced when releasing from the standby state. In contrast thereto, the related technique, described in FIG. 6, includes the signal level determining circuit 41 on the downstream side of the level converter circuit 40. This signal level determining circuit 41 receives an output of the level converter circuit 40 to output a constant level signal during the standby time without dependency upon the level of the output signal of the level converter circuit. This signal level determining circuit 411 is an ordinary logic circuit, specifically a NAND circuit, operated by a single power supply voltage from a second power supply line 36 even if the first power supply line 35 is turned off. The signal level determining circuit is operated at a faster speed than that of the level converter circuit 40. Thus, when the standby state is released (deactivated) and the standby signal SLP is changed to a LOW level, the signal level determining circuit may respond instantly. The operation of the signal level determining circuit occurs more promptly than the change in the output level of the level converter circuit 40 brought about by a change in the logic states of NOR gates 45, 46 caused by propagation of the SLP signal to the first circuit block 38. There is thus a fear that, when the signal level of the signal SLP is changed when releasing the standby state, a malfunctioning signal is transiently output to Dout. It is because a combinational gate circuit 41, outputting a constant level signal in the standby state without dependency upon the output signal of the level converter circuit, is provided on the downstream side of the level converter circuit 40. This combinational gate circuit receives an output signal of the level converter circuit 40 and a standby signal as input signals.

Further, with the above-described respective Exemplary embodiments, it is possible to prevent signal delay otherwise caused by providing, on the downstream side of the level shift circuit, the signal level determining circuit that is not needed for level shifting during the normal operation. The following Table 1, showing the result of investigating the delay time, indicates the results of comparison of the delay time caused by the comparative art according to FIG. 6 and that caused by the Exemplary embodiments of the present invention.

TABLE 1

|  | Circuits of Exemplary embodiments | Circuit of Comparative art |
|---|---|---|
| Rise delay time | 801 ps | 1070 ps |
| Fall delay time | 380 ps | 507 ps |
| Total delay | 1181 ps | 1577 ps |

The above shows the results of simulation with the same circuit constants under the same process conditions. The results indicate that the operation with respect to the rise delay and fall delay of the signal Dout of the present Exemplary embodiments is faster than with the comparative art.

Further, with the Exemplary embodiments of the present invention, the output level of the level shift circuit may reliably be fixed at a HIGH level or at a LOW level, with the result that such problem as tunneling current is not met on the downstream side.

Although the present invention has so far been described with reference to preferred exemplary embodiments, the present invention is not to be restricted to the exemplary embodiments. It is to be appreciated that those skilled in the art can change or modify the exemplary embodiments without departing from the spirit and the scope of the present invention.

For example, the transistors MSP2, MSP4 of FIG. 1 may be replaced by a sole transistor. The transistors MMP4 and MMP9 of FIG. 4 may also be interchanged such that the transistor MMP9 is connected closer to the second power supply VDD2 than the transistor MMP4.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A level shift circuit for transmitting a signal from a circuit operated by a first power supply to another circuit operated by a second power supply, comprising:
    a level converter circuit, barrier gate circuit and a holding circuit;
    wherein said level converter circuit comprising:
    a first transistor of a first conductivity type having a source and a drain connected between said second power supply and a first output terminal and having a gate connected to a second output terminal;
    a second transistor of the first conductivity type having a source and a drain connected between said second power supply and said second output terminal and having a gate connected to said first output terminal;
    a first transistor of a second conductivity type having a source grounded and having a drain connected to the first output terminal; and
    a second transistor of the second conductivity type having a source grounded and having a drain connected to the second output terminal;
    wherein said barrier gate circuit receives an input signal of a first power supply system and outputs a gate signal of said first transistor of the second conductivity type and a gate signal of said second transistor of the second conductivity type; said barrier gate circuit receiving a standby signal to set said first and second transistors of the second conductivity type to off-states; and
    wherein said holding circuit holds said first and second output terminals at a constant voltage when said first and second transistors of said second conductivity type are both in the off-states.

2. The level shift circuit according to claim 1, wherein said holding circuit comprises:
    a third transistor of the first conductivity type having a source and a drain connected respectively to a source and a drain of said first transistor of the first conductivity type and having a gate coupled to an inverted signal of said standby signal; and
    a fourth transistor of the first conductivity type having a source and a drain connected respectively to a source and a drain of said second transistor of the first conductivity type and having a gate coupled to an inverted signal of said standby signal.

3. The level shift circuit according to claim 1, wherein said holding circuit comprises:
    a third transistor of the second conductivity type having a source grounded and having a drain and a gate connected respectively to said first output terminal and to said second output terminal; and
    a fourth transistor of the second conductivity type having a source grounded and having a drain and a gate connected respectively to said second output terminal and to said first output terminal.

4. The level shift circuit according to claim 1, wherein said holding circuit comprises:
    a fifth transistor of the second conductivity type having a source grounded and having a drain and a gate coupled respectively to said first output terminal and to said standby signal;
    a sixth transistor of the second conductivity type having a source grounded and having a drain and a gate coupled respectively to said second output terminal and to said standby signal;
    a fifth transistor of the first conductivity type having a source and a drain connected between said second power supply and the first output terminal in series with said first transistor of the first conductivity type; and
    a sixth transistor of a first conductivity type having a source and a drain connected between said second power supply and the second output terminal in series with said second transistor of the first conductivity type.

5. The level shift circuit according to claim 1, wherein said barrier gate circuit comprises:
    a seventh transistor of the second conductivity type having a source grounded and having a drain and a gate coupled respectively to a gate signal of said first transistor of the second conductivity type and to said standby signal of a second power supply system; and
    an eighth transistor of the second conductivity type having a source grounded and having a drain and a gate coupled respectively to a gate signal of said second transistor of the second conductivity type and to said standby signal of said second power supply system.

6. The level shift circuit according to claim 2, wherein said barrier gate circuit comprises:
    a seventh transistor of the second conductivity type having a source grounded and having a drain and a gate coupled respectively to a gate signal of said first transistor of the second conductivity type and to said standby signal of a second power supply system; and an eighth transistor of the second conductivity type having a source grounded and having a drain and a gate coupled respectively to a gate signal of said second transistor of the second conductivity type and to said standby signal of said second power supply system.

7. The level shift circuit according to claim 3, wherein said barrier gate circuit comprises:
- a seventh transistor of the second conductivity type having a source grounded and having a drain and a gate coupled respectively to a gate signal of said first transistor of the second conductivity type and to said standby signal of a second power supply system; and
- an eighth transistor of the second conductivity type having a source grounded and having a drain and a gate coupled respectively to a gate signal of said second transistor of the second conductivity type and to said standby signal of said second power supply system.

8. The level shift circuit according to claim 4, wherein said barrier gate circuit comprises:
- a seventh transistor of the second conductivity type having a source grounded and having a drain and a gate coupled respectively to a gate signal of said first transistor of the second conductivity type and to said standby signal of a second power supply system; and
- an eighth transistor of the second conductivity type having a source grounded and having a drain and a gate coupled respectively to a gate signal of said second transistor of the second conductivity type and to said standby signal of said second power supply system.

9. The level shift circuit according to claim 1, wherein said barrier gate circuit comprises:
- a first gate circuit that generates a gate signal of said first transistor of the second conductivity type;
- a second gate circuit that generates a gate signal of said second transistor of the second conductivity type; and
- an inverter of said first power supply system that receives an inverted signal of said standby signal of said second power supply system to output a standby signal of said first power supply system;
- said first and second gate circuits being connected to said first power supply via a transistor of the first conductivity type having the gate connected to said output of said inverter.

10. The level shift circuit according to claim 2, wherein said barrier gate circuit comprises:
- a first gate circuit that generates a gate signal of said first transistor of the second conductivity type;
- a second gate circuit that generates a gate signal of said second transistor of the second conductivity type; and
- an inverter of said first power supply system that receives an inverted signal of said standby signal of said second power supply system to output a standby signal of said first power supply system;
- said first and second gate circuits being connected to said first power supply via a transistor of the first conductivity type having the gate connected to said output of said inverter.

11. The level shift circuit according to claim 3, wherein said barrier gate circuit comprises:
- a first gate circuit that generates a gate signal of said first transistor of the second conductivity type;
- a second gate circuit that generates a gate signal of said second transistor of the second conductivity type; and
- an inverter of said first power supply system that receives an inverted signal of said standby signal of said second power supply system to output a standby signal of said first power supply system;
- said first and second gate circuits being connected to said first power supply via a transistor of the first conductivity type having the gate connected to said output of said inverter.

12. The level shift circuit according to claim 4, wherein said barrier gate circuit comprises:
- a first gate circuit that generates a gate signal of said first transistor of the second conductivity type;
- a second gate circuit that generates a gate signal of said second transistor of the second conductivity type; and
- an inverter of said first power supply system that receives an inverted signal of said standby signal of said second power supply system to output a standby signal of said first power supply system;
- said first and second gate circuits being connected to said first power supply via a transistor of the first conductivity type having the gate connected to said output of said inverter.

13. The level shift circuit according to claim 5, wherein said barrier gate circuit comprises:
- a first gate circuit that generates a gate signal of said first transistor of the second conductivity type;
- a second gate circuit that generates a gate signal of said second transistor of the second conductivity type; and
- an inverter of said first power supply system that receives an inverted signal of said standby signal of said second power supply system to output a standby signal of said first power supply system;
- said first and second gate circuits being connected to said first power supply via a transistor of the first conductivity type having the gate connected to said output of said inverter.

* * * * *